US009048824B2

(12) United States Patent
Chan et al.

(10) Patent No.: US 9,048,824 B2
(45) Date of Patent: Jun. 2, 2015

(54) PROGRAMMABLE EQUALIZATION WITH COMPENSATED IMPEDANCE

(71) Applicant: Intel Corporation, Santa Clara, CA (US)

(72) Inventors: Hong H. Chan, Beaumont, CA (US); Jayson D. Strayer, Hillsboro, OR (US); My M. Hua, Renton, WA (US)

(73) Assignee: Intel Corporation, Santa Clara, CA (US)

( * ) Notice: Subject to any disclaimer, the term of this patent is extended or adjusted under 35 U.S.C. 154(b) by 8 days.

(21) Appl. No.: 13/712,574

(22) Filed: Dec. 12, 2012

(65) Prior Publication Data

US 2014/0159769 A1    Jun. 12, 2014

(51) Int. Cl.
| | |
|---|---|
| *G11C 7/12* | (2006.01) |
| *H04L 25/12* | (2006.01) |
| *H03K 19/00* | (2006.01) |
| *H04L 25/02* | (2006.01) |
| *G11C 7/10* | (2006.01) |

(52) U.S. Cl.
CPC ........ *H03K 19/0005* (2013.01); *H04L 25/0278* (2013.01); *H04L 25/0298* (2013.01); *G11C 7/1048* (2013.01); *G11C 7/1051* (2013.01)

(58) Field of Classification Search
CPC ........... H04L 25/0278; H04L 25/0298; H03K 19/0005; H03K 19/1772; H03K 19/17712; H03K 19/17704; G11C 7/1048
USPC ...................................................... 326/30, 45
See application file for complete search history.

(56) References Cited

U.S. PATENT DOCUMENTS

| | | | | |
|---|---|---|---|---|
| 5,739,707 | A * | 4/1998 | Barraclough ................. | 327/112 |
| 7,005,903 | B2 | 2/2006 | Chan et al. | |
| 7,148,725 | B1 | 12/2006 | Chan et al. | |
| 7,199,615 | B2 * | 4/2007 | Stojanovic et al. ............. | 326/82 |
| 7,215,144 | B2 * | 5/2007 | Mitby et al. ..................... | 326/82 |
| 7,227,382 | B1 * | 6/2007 | Talbot et al. .................... | 326/87 |
| 7,239,560 | B2 * | 7/2007 | Lee et al. ................. | 365/189.05 |
| 7,307,447 | B2 * | 12/2007 | Clements et al. ............... | 326/30 |
| 7,323,901 | B2 * | 1/2008 | Aoyama et al. ................. | 326/30 |
| 7,382,152 | B2 * | 6/2008 | Hamanaka ....................... | 326/30 |
| 7,443,212 | B2 * | 10/2008 | Hayashi et al. ............... | 327/108 |
| 7,446,558 | B2 * | 11/2008 | Yuan ................................ | 326/30 |
| 7,579,861 | B2 * | 8/2009 | Shin et al. ....................... | 326/26 |
| 7,692,447 | B2 * | 4/2010 | Cranford et al. ................ | 326/30 |
| 7,795,919 | B2 * | 9/2010 | Fujiwara ......................... | 326/87 |
| 7,944,233 | B1 * | 5/2011 | Lee ................................. | 326/30 |

(Continued)

OTHER PUBLICATIONS

First Office Action in Related Chinese Patent Application No. 201320823088.8, mailed Apr. 2, 2014, 4 pages including English translation.

(Continued)

*Primary Examiner* — Alexander H Taningco
*Assistant Examiner* — Kurtis R Bahr
(74) *Attorney, Agent, or Firm* — Blakely, Sokoloff, Taylor & Zafman LLP

(57) ABSTRACT

Described is a chip comprising: a pull-up driver with a first impedance, the pull-up driver coupled to a node; a pull-down driver with a second impedance, the pull-down driver coupled to the node; and an equalizer coupled to the pull-up and pull-down drivers, wherein the equalizer is operable to be trained to deemphasize a signal driven on the node while maintaining the first and second impedances substantially constant.

20 Claims, 6 Drawing Sheets

(56) References Cited

U.S. PATENT DOCUMENTS

| | | | |
|---|---|---|---|
| 7,952,382 B2* | 5/2011 | Moon | 326/30 |
| 7,969,183 B2* | 6/2011 | Kinoshita et al. | 326/30 |
| 7,990,175 B2* | 8/2011 | Koo | 326/30 |
| 2004/0251940 A1* | 12/2004 | Hayashi et al. | 327/170 |
| 2005/0040845 A1* | 2/2005 | Park | 326/30 |
| 2005/0127967 A1* | 6/2005 | Allen | 327/170 |
| 2006/0066350 A1* | 3/2006 | Chen | 326/82 |
| 2007/0103186 A1* | 5/2007 | Clements et al. | 326/30 |
| 2008/0137721 A1* | 6/2008 | Hsu et al. | 375/231 |
| 2009/0167368 A1 | 7/2009 | Chan et al. | |
| 2009/0237109 A1* | 9/2009 | Haig et al. | 326/30 |
| 2010/0188116 A1* | 7/2010 | Iizuka et al. | 326/30 |
| 2010/0283503 A1* | 11/2010 | Hollis | 326/30 |
| 2011/0026334 A1* | 2/2011 | Bae et al. | 365/189.11 |
| 2011/0109361 A1* | 5/2011 | Nishio | 327/170 |
| 2012/0106219 A1* | 5/2012 | Okuda | 363/127 |

OTHER PUBLICATIONS

Office Action issued in co-pending Chinese Patent Application No. 201320823088.8, mailed Sep. 25, 2014, 6 pages including English Translation.

* cited by examiner

PROGRAMMABLE EQUALIZATION WITH COMPENSATED IMPEDANCE

BACKGROUND

Typically, when equalization is performed by an input-output (I/O) driver to adjust the $V_{OL}$ and/or $V_{OH}$ levels of a signal driven by the I/O driver, termination impedance (of pull-up and/or pull-down) of the driver is modulated. Such modulation of the termination impedance may cause signal integrity issues e.g., over-shoot, under-shoot, ringing, unexpected signal reflections, etc. Signal integrity issues may result in incorrect date reception and sampling at a receiver end.

BRIEF DESCRIPTION OF THE DRAWINGS

Embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
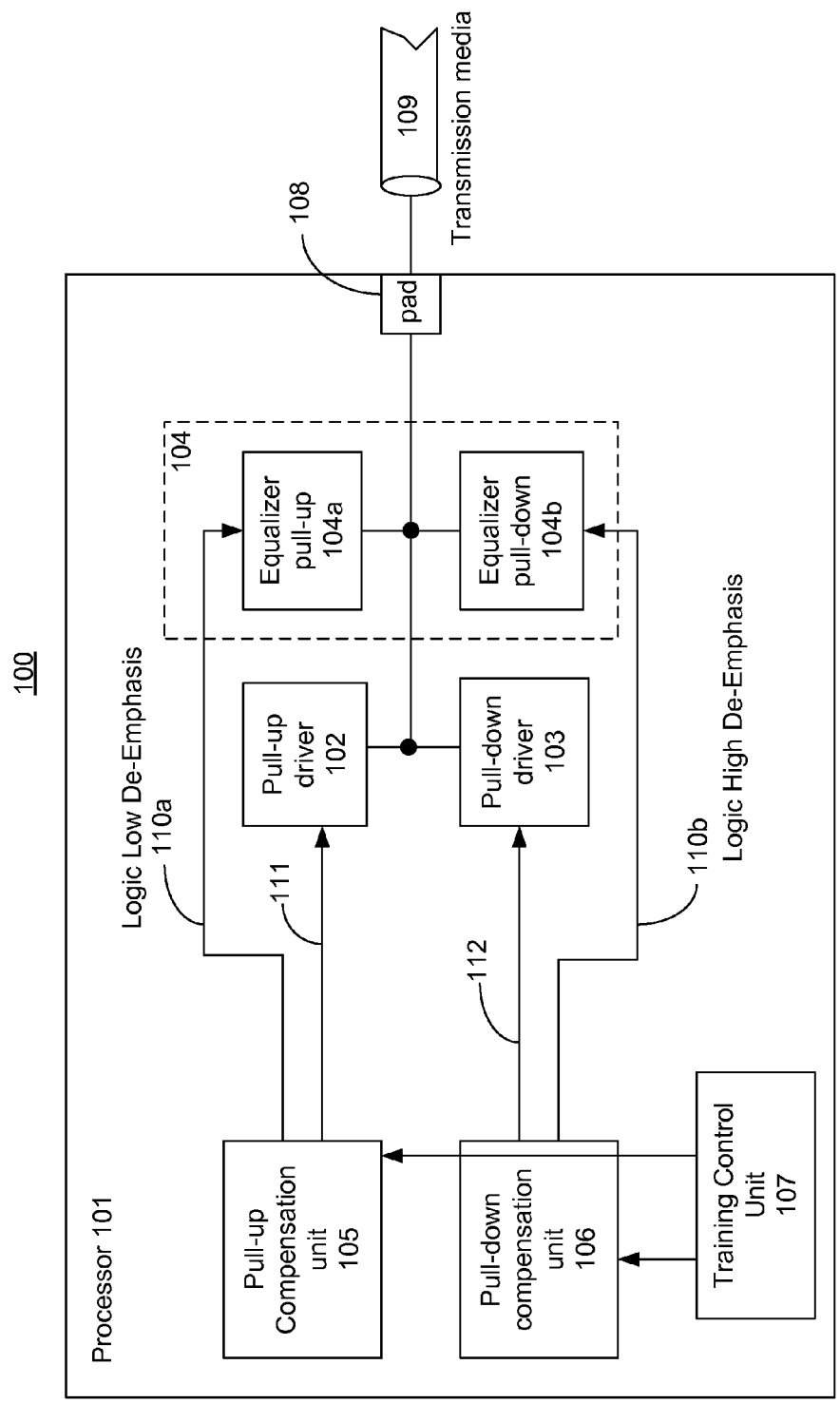
FIG. 1A shows a driver circuit.

Typical, equalization lacks the ability to provide finer granularity to equalization levels than presently possible. The term "fine granularity" generally refers to small equalization levels e.g., 1% of ground or supply levels. Granularity for de-emphasis can also be expressed in dB because it is relative to signal swing. For example, a granularity of 0.2 dB. One reason for that lack of ability is the modulation of termination impedances (pull-up and/or pull-down) of the I/O drivers when the I/O drivers are operating in equalization and/or non-equalization modes. The embodiments provide an apparatus and method for training I/O driver impedances to accomplish a wide range of programmable finer granularity of equalization, for a signal driven by the I/O driver, while maintaining termination impedances of the I/O driver substantially constant.

The term "equalization" generally refers to a process of modulating amplitude of a signal driven by a driver. The term "de-emphasis" generally refers to decreasing a voltage level of a signal. For example, de-emphasizing $V_{OH}$ level of a signal refers to reducing the $V_{OH}$ level relative to ground. Likewise, de-emphasizing $V_{OL}$ level of a signal refers to increasing the $V_{OL}$ level relative to ground. The term "scaling" refers to converting a design (schematic and layout) from one process technology to another process technology. The terms "substantially," "close," "approximately," "near," "about," refer to being within +/−20% of a target value.

In one embodiment, a novel method and apparatus for training pull-down and pull-up impedances are disclosed that are decoupled from the training of an equalizer of the I/O driver. In such an embodiment, impedance of the pull-up driver is independently controllable from impedance of the pull-down driver. In one embodiment, a two-dimensional impedance training algorithm (with first and second loops) is applied to train the pull-up and pull-down drivers and the equalizer. In one embodiment, equalizer (part of the I/O driver) is decoupled from the pull-up and pull-down drivers in that the equalizer is controllable by a code (one or more signals) which is separate from the code used to control the impedance of the pull-up and pull-down I/O drivers.

In one embodiment, impedances of the pull-up and pull-down drivers of the I/O are trained to have specific target (or desired) impedances while the equalizer of the I/O driver is disabled. After training the pull-up and pull-down driver impedances, equalizer is enabled and trained to have a specific target (or desired) equalization level granularity. In one embodiment, during the process of training the equalizer, pull-up and pull-down drivers of the I/O are trained again to maintain their impedances (i.e., to keep their impedances at the trained target level) while the equalizer is being trained. This process forms a two-dimensional training process that trains pull-up and pull-down impedances of the I/O driver in the first loop of the training process, and trains the granularity code of the equalizer in the second loop of the training process. In one embodiment, closed-loop impedance training of the pull-up and pull-down drivers is performed by incrementing granularity code of the equalizer by one (or another small number e.g., two). In one embodiment, training process is initiated by the BIOS (Basic Input/Output System) associated with the chip/processor having the I/O driver with equalizer.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a", "an", and the include plural references. The meaning of in includes in and "on."

As used herein, unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The terms "MN" herein indicates an n-type transistor (e.g., NMOS, NPN BJT, etc.) and the term "MP" indicates a p-type transistor (e.g., PMOS, PNP BJT, etc.).

FIG. 1A illustrates a system 100 with a processor 101 with programmable equalization and compensated impedance for an input-output (I/O) driver, according to one embodiment of the disclosure. In one embodiment, processor 101 comprises a driver coupled to a pad 108. In one embodiment, the driver includes a pull-up driver 102, a pull-down driver 103, and an equalizer 104. In one embodiment, processor 101 further comprises a pull-up compensation unit 105, pull-down compensation unit 106, and a training control unit 107. In one embodiment, processor 101 is coupled to another device (e.g., another processor) via a transmission media 109. In one embodiment, transmission media 109 is a transmission line.

In one embodiment, equalizer 104 and the pull-up/pull-down drivers (102 and 103) are part of a parallel I/O link. Generally, in a parallel I/O link of 32 bits there are 32 I/Os to transfer data in one clock cycle. Examples of parallel I/O link include Double-Data-Rate busses (DDR2, DDR3, DDR4, etc). In one embodiment, pull-up/pull-down drivers (102 and 103) are part of a serial I/O link. Generally, in a serial I/O link of 8 bits, one serial I/O will transfer data in eight clock cycles. Serial links are operated with higher clock rates than parallel links, in general. Examples of serial I/O link include Peripheral Component Interconnect Express (PCIe) I/O link.

In one embodiment, equalizer 104 comprises a pull-up section 104a (also referred as equalizer pull-up section) and a pull-down section 104b (also referred to as equalizer pull-down section). In one embodiment, equalizer 104 is decoupled from the pull-up and pull-down drivers (102 and 103) in that the control signals 110a and 110b for the equalizer 104 are different than and separate from the control signals 111 and 112 of the pull-up/pull-down drivers (102 and 103). In one embodiment, control signal 110a (which may be a bus with one or more bits) turns on/off one or more pull-up devices of the equalizer pull-up section 104a. In one embodiment, control signal 110b (which may be a bus with one or more bits) turns on/off one or more pull-down devices of the equalizer pull-down section 104b.

In one embodiment, impedance of the pull-up driver 102 (also called first impedance) is controlled by signal 111 which is used to turn on/off one or more pull-up devices of the pull-up driver 102. In one embodiment, impedance of the pull-down driver 103 (also called second impedance) is controlled by signal 112 which is used to turn on/off one or more pull-down devices of the pull-down driver 103. The bit values of the control signals 110a, 111, 112, and 110b, are also called a code or bus.

In one embodiment, pull-up compensation unit 105 trains the pull-up driver 102 (via code 111) and the equalizer pull-up section 104a (via code 110a) to have particular impedances. In one embodiment, pull-down compensation unit 106 trains pull-down driver 103 (via code 112) and equalizer pull-down section 104b (via code 110b) to have particular impedances. In one embodiment, impedances of pull-up/pull-down drivers 102 and 103, and equalizer pull-up/pull-down sections 104a and 104b are programmable by software or hardware.

For example, impedances can be programmed by BIOS or any other operating system, and/or by fuses. In one embodiment, pull-up and pull-down compensation units 105 and 106 determine impedance codes 110a, 111, 112, and 110b by using reference impedance (which may be an external resistor).

In one embodiment, training control unit 107 controls the compensation process performed by pull-up and pull-down compensation units 105 and 106 so that granularity of equalizer 104 may be set (to any level) while maintaining impedances of pull-up and pull-down drivers 102 and 103 substantially constant. In one embodiment, training control unit 107 controls the flow of the method discussed with reference to FIG. 4.

Referring back to FIG. 1A, in one embodiment pull-up driver compensation unit 105 is operable to determine code 111 for setting the first impedance for pull-up driver 102. In such an embodiment, pull-up driver compensation unit 105 is operable to determine code 110a for setting pull-up granularity for equalizer pull-up section 104a for de-emphasizing the signal driven on pad 108 by equalizer 104. In one embodiment, pull-down driver compensation unit 106 is operable to determine code 112 for setting the second impedance for pull-down driver 103. In such an embodiment, pull-up driver compensation unit 105 is operable to determine code 110b for setting pull-down granularity for equalizer pull-down section 104b for de-emphasizing the signal driven on pad 108 by equalizer 104.

In one embodiment, equalizer 104 is disabled when pull-up driver compensation unit 105 is determining code 111 for setting the first impedance for pull-up driver 102. In one embodiment, equalizer 104 is disabled when pull-down driver compensation unit 106 is determining code 112 for setting the second impedance for pull-down driver 103. In one embodiment, pull-up driver compensation unit 105 and pull-down driver compensation unit 106 determine codes 111 and 112 for setting the first and second impedances prior to setting codes 110a and 110b for the pull-up and pull-down granularities for de-emphasizing the signal, driven on pad 108, by equalizer 104. As discussed, codes 111, 110a, 112, and 110b for the pull-up and pull-down granularities for de-emphasizing the signal, driven on pad 108, by equalizer 104 are programmable.

In one embodiment, pull-up driver compensation unit 105 and pull-down driver compensation unit 106 are operable to determine codes 111 and 112 again for setting the first and second impedances after setting codes 110a and 110b for the pull-up and pull-down granularities for de-emphasizing the signal by equalizer 104. In one embodiment, codes 110a and 110b for the pull-up and pull-down granularities for de-emphasizing the signal, driven on pad 108 by equalizer 104, are different when equalizer 104 is in equalization mode than codes 110a and 110b for the pull-up and pull-down granularities when equalizer 104 is in non-equalization mode. In one embodiment, codes 110a and 110b for the pull-up and pull-down granularities for de-emphasizing the signal, driven on pad 108, by the equalizer 104, are same when equalizer 104 is in equalization mode than codes 110a and 110b for the pull-up and pull-down granularities when equalizer 104 is in non-equalization mode.

The term "equalization mode" generally refers to the circuit configuration/operation when the equalizer 104 is enabled to equalize (e.g., de-emphasize) the signal on pad 108. The term "non-equalization mode" generally refers to the circuit configuration/operation when the equalizer 104 is enabled but is not set to emphasize the signal on pad 108. In one embodiment, first and second impedances are substantially constant during a period when equalizer 104 is in non-equalization mode or equalization mode. In one embodiment, equalizer 104 can be set to enable equalization mode or to disable equalization mode. In one embodiment, in enable equalization mode, equalizer 104 turns off one of the equalization segments (e.g., equalizer pull-up section 104a) and turns off another equalization segment (e.g., equalizer pull-down section 104b). For example, when driver 200 is driving a zero on pad 108, equalizer 104 will turn off equalizer pull-down section 104b but turn on equalizer pull-up section 104a. In another example, when driver 200 is driving a one on pad 108, equalizer 104 turns off equalizer pull-up section 104a but turns on equalizer pull-down section 104b. Equalization code is labeled as 110a and 110b, while non-equalization codes are labeled as 111 and 112.

In one embodiment, codes 110a and 110b for the pull-up and pull-down granularities for de-emphasizing the signal, driven on pad 108 by equalizer 104, are same when equalizer 104 is in equalization mode than codes 110a and 110b for the pull-up and pull-down granularities when equalizer 104 is in non-equalization mode.

Figure 1B:
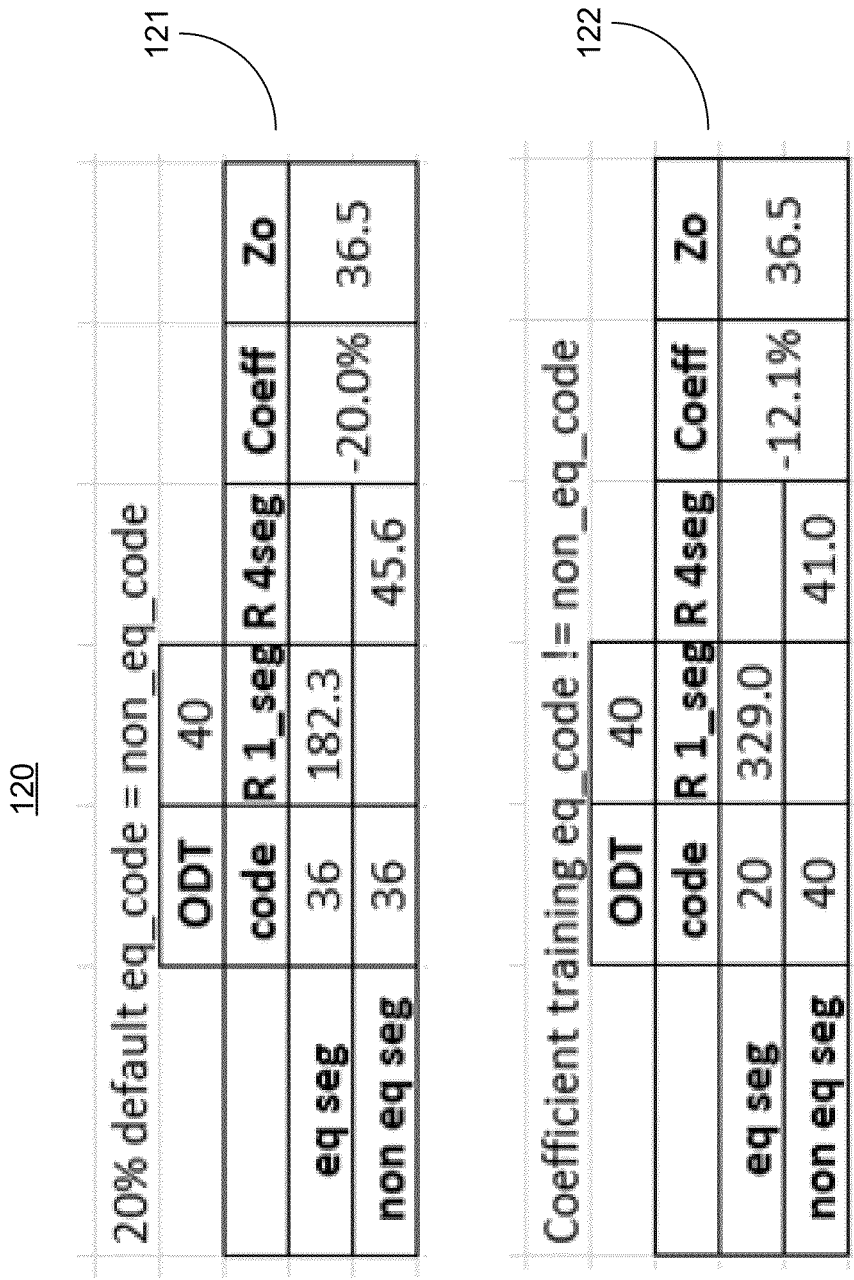
FIG. 1B shows codes for use on the driver circuit of FIG. 1A.

FIG. 1B is an illustration 120 of the operation of equalization segment 104 (e.g., 104b) of the equalizer 104 and non-equalization segment of the pull-down (e.g., 103) during equalization mode and non-equalization mode, according to one embodiment. While the embodiment of FIG. 1B illustrates the behavior of pull-down segments (e.g., 103 and 104b), the same explanation also applies to pull-up segments (e.g., 102 and 104a).

FIG. 1B shows two tables, table 121 and table 122. Table 121 illustrates the on-die termination code (ODT) for the pull-down driver 103 and equalizer pull-down section 104b when equalization code 110b is the same as non-equalization code 112. Table 122 illustrates ODT code for pull-down driver 103 and equalizer pull-down section 104b when equalization code 110b is different from non-equalization code 112. In this example, the entire pull-down section (i.e., pull-down driver 103 and equalizer pull-down section 104b) are divided into five segments. The first four segments (R1_seg) form pull-down section 103 while the fourth segment (R4_seg) forms equalization pull-down section 104b. The term "Zo" stands for impedance of the entire pull-down section (i.e., pull-down driver 103 and equalizer pull-down section 104b).

With reference to table 121, in the pull-down case, 110b is "equalization segment code," and 112 is the "non-equalization segment code." Each of these segments has codes from 0 to 64, i.e., code 0 results in the highest impedance and code 64 results in the lowest impedance. "Equalization segment" is 1 out of total 5 segments of the driver and "non eq seg" is 4 out of total 5. So when a two dimensional (2-D) sweep of these two codes is performed, one combination of these two codes will give the total impedance ("equalization segment" in parallel to "non-equalization segment") as ~36 Ohm when equalization is set to off and the equalization coefficient is at desired value when equalization is turned on.

Table 121 is the result of a single sweep of the 2-D sweep. In this example, code 110b is 36 and code 112 is 36, which results in impedance of pull-down driver (103 and 104b) of 36.5 Ohms and equalization coefficient to be −20%. Table 122 shows another 2-D sweep result. In this case, code 110b is 20 and code 112 is 40, which results in impedance of 36.5 Ohms but equalization coefficient of −12.1%.

So, given a desired impedance (e.g., 36.5 Ohm) and equalization, coefficient (which refers to equalization granularity) codes of 110b and 112 for pull-down driver 103 are the same regardless of equalization (i.e., equalizer pull-down section 104b) being on or off. In one embodiment, the function of equalizer 104 is that when it is on, it will turn off "equalization segment" and turn on opposite direction of "equalization segment" to maintain constant driver impedance. For example, when driver is driving a zero on pad 108, equalizer 104 will turn off equalizer pull-down section 104b but turn on equalizer pull-up section 104a. In another example, when driver is driving a one on pad 108, equalizer 104 turns off equalizer pull-up section 104a but turns on equalizer pull-down section 104b. When equalizer 104 is set to be in off state, the "equalization segment" is turned on resulting in a total of five segments being used for transmission of data on pad 108. In such an embodiment, there will be no de-emphasis and so the equalization coefficient is 0.

Figure 2:
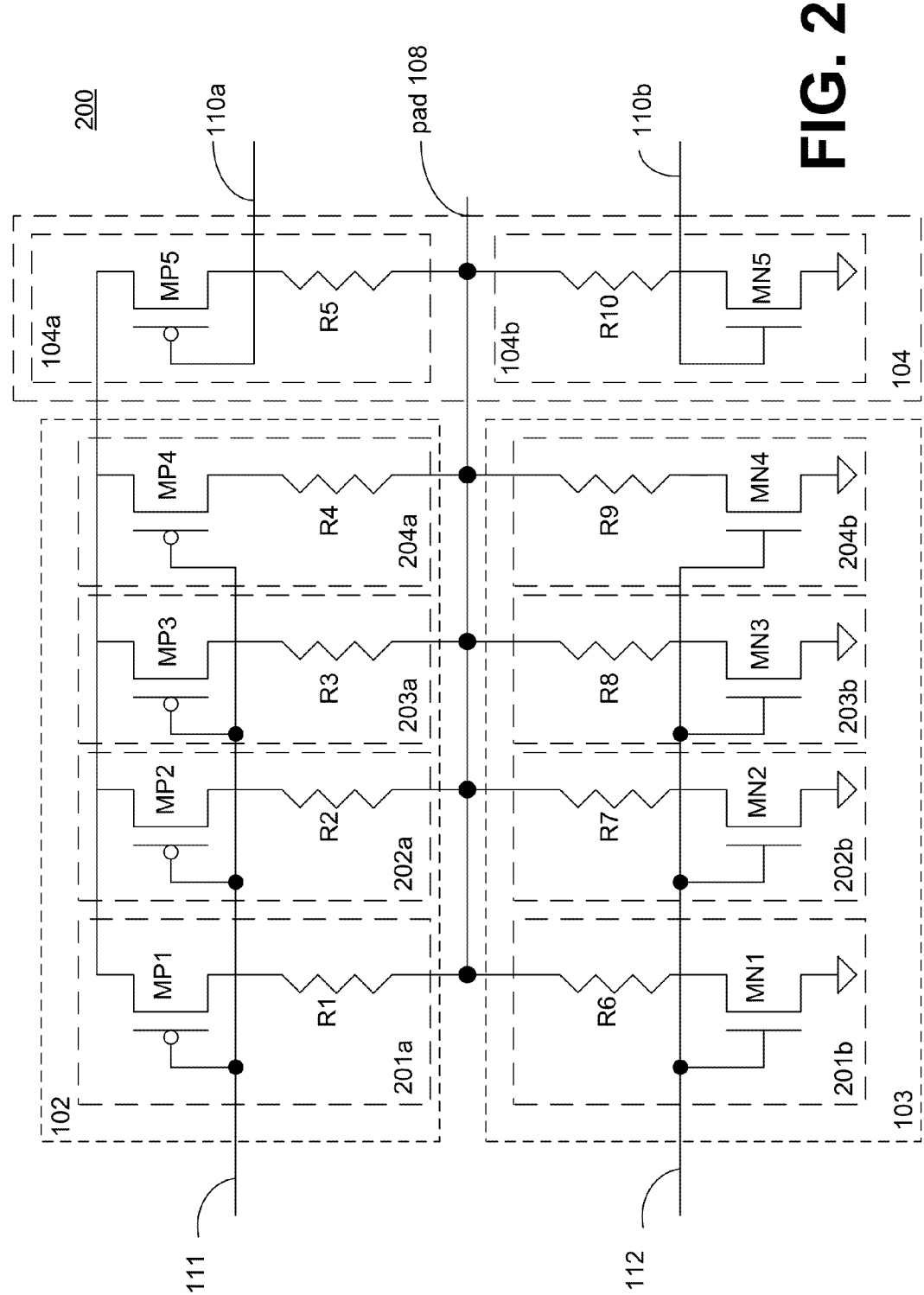
FIG. 2 shows parallel transistor segments of the driver circuit of FIG. 1A.

FIG. 2 is an I/O driver 200 with decoupled pull-up/pull-down and equalizer circuit modules to provide fine granularity of equalization, according to one embodiment of the disclosure. It is pointed out that those elements of FIG. 2 having the same reference numbers (or names) as the elements of any other figure can operate or function in any manner similar to that described, but are not limited to such.

In this exemplary embodiment, I/O driver 200 is shown with five segments—the first four segments (from the left) forming pull-up and pull-down drivers 102 and 103, while the fifth segment forms equalizer 104 (104a and 104b). In other embodiments, other number of segments may be used for the pull-up/pull-down drivers 102 and 103, and equalizer 104. The embodiment of FIG. 2 illustrates that the equalizer 104 (sections 104a and 104b) is controlled independent of the pull-up and pull-down drivers 102 and 103. In such an embodiment, the granularity of equalizer 104 can be independently programmed to any level while maintaining the impedances of pull-up driver 102 and pull-down driver 103 substantially constant.

In one embodiment, pull-up driver 102 comprises four segments of pull-up drivers 201a, 202a, 203a, and 204a which are controllable by code 111, where each pull-up driver 102 (e.g., 201a) may receive its own bit from the code 111 to turn on/off its respective transistor to adjust the first impedance. In one embodiment, each pull-up driver (e.g., 201a) comprises one or more p-type device(s) coupled in series with one or more resistor(s).

For example, pull-up driver 201a comprises MP1 coupled to R1, pull-up driver 202a comprises MP2 coupled in series to R2, pull-up driver 203a comprises MP3 coupled in series to R3, and pull-up driver 204a comprises MP4 coupled in series to R4. The resistors R1 -R4 may be implemented with any known resistor technology including transistors biased in linear region to form a resistor. The pull-up drivers 201a, 202a, 203a, and 204a are coupled to the pad 108 via the resistors R1-R4. In one embodiment, each segment of pull-up driver 102 is of different weight i.e., size. For example in one embodiment, transistors MP1-MP4 are binary weighted. In another embodiment, transistors MP1-MP4 are thermometer weighted. In other embodiments, other weighting techniques may be used for transistors forming MP1-MP4. In one embodiment, each segment of the pull-up driver 102 is of equal weight i.e., size. So as not to obscure the embodiments of this disclosure, other components (e.g., electrostatic discharge unit, pre-drivers, etc.) of the I/O driver are not shown.

In one embodiment, pull-down driver 103 comprises four segments of pull-down drivers 201b, 202b, 203b, and 204b which are controllable by code 112, where each pull-down driver 103 (e.g., 201b) may receive its own bit from the code 112 to turn on/off its respective transistor to adjust the second impedance. In one embodiment, each pull-down driver (e.g., 201*b*) comprises one or more n-type device(s) coupled in series with one or more resistor(s).

For example, pull-down driver 201*b* comprises MN1 coupled to R6, pull-down driver 202*b* comprises MN2 coupled in series to R7, pull-down driver 203*b* comprises MN3 coupled in series to R8, and pull-down driver 204*b* comprises MN4 coupled in series to R9. The resistors R6-R9 may be implemented with any known resistor technology including transistors biased in linear region to form a resistor. In one embodiment, pull-down drivers 201*b*, 202*b*, 203*b*, and 204*b* are coupled to pad 108 via resistors R6-R8. In one embodiment, each segment of pull-down driver 103 is of different weight i.e., size. For example in one embodiment, transistors MN1-MN4 are binary weighted. In another embodiment, transistors MN1-MN4 are thermometer weighted. In other embodiments, other weighting techniques may be used for transistors forming MN1-MN4. In one embodiment, each segment of the pull-down driver 103 is of equal weight i.e., size.

In one embodiment, equalizer pull-up section 104*a* of equalizer 104 comprises a p-type device MP5 coupled in series with a resistor R5 which in turn is coupled to pad 108. As discussed herein the equalizer 104 is decoupled from pull-up and pull-down drivers 102 and 103. In one embodiment, gate terminal of MP5 is controlled by code 110*a*. While the embodiment of FIG. 2 shows a single pull-up transistor MP5 for equalizer pull-up section 104*a* of equalizer 104, multiple transistors may be used in parallel to one another and controllable by bits of code 110*a*. In one embodiment, the multiple transistors of MP5 are binary weighted. In one embodiment, the multiple transistors of MP5 are thermometer weighted. In other embodiments, other weighting techniques may be used for transistors forming MP5.

In one embodiment, equalizer pull-down section 104*b* of the equalizer 104 comprises an n-type device MN5 coupled in series with a resistor R10 which in turn is coupled to the pad 108. As discussed herein the equalizer 104 is decoupled from the pull-up and pull-down drivers 102 and 103 respectively. In one embodiment, the gate terminal of MN5 is controlled by code 110*b*. While the embodiment of FIG. 2 shows a single transistor MN5 for the equalizer pull-down section 104*b*, multiple transistors may be used in parallel to one another and controllable by bits of code 110*b*. In one embodiment, multiple transistors of MN5 are binary weighted. In one embodiment, multiple transistors of MN5 are thermometer weighted. In other embodiments, other weighting techniques may be used for transistors forming MN5.

Figures 3A, 3B:
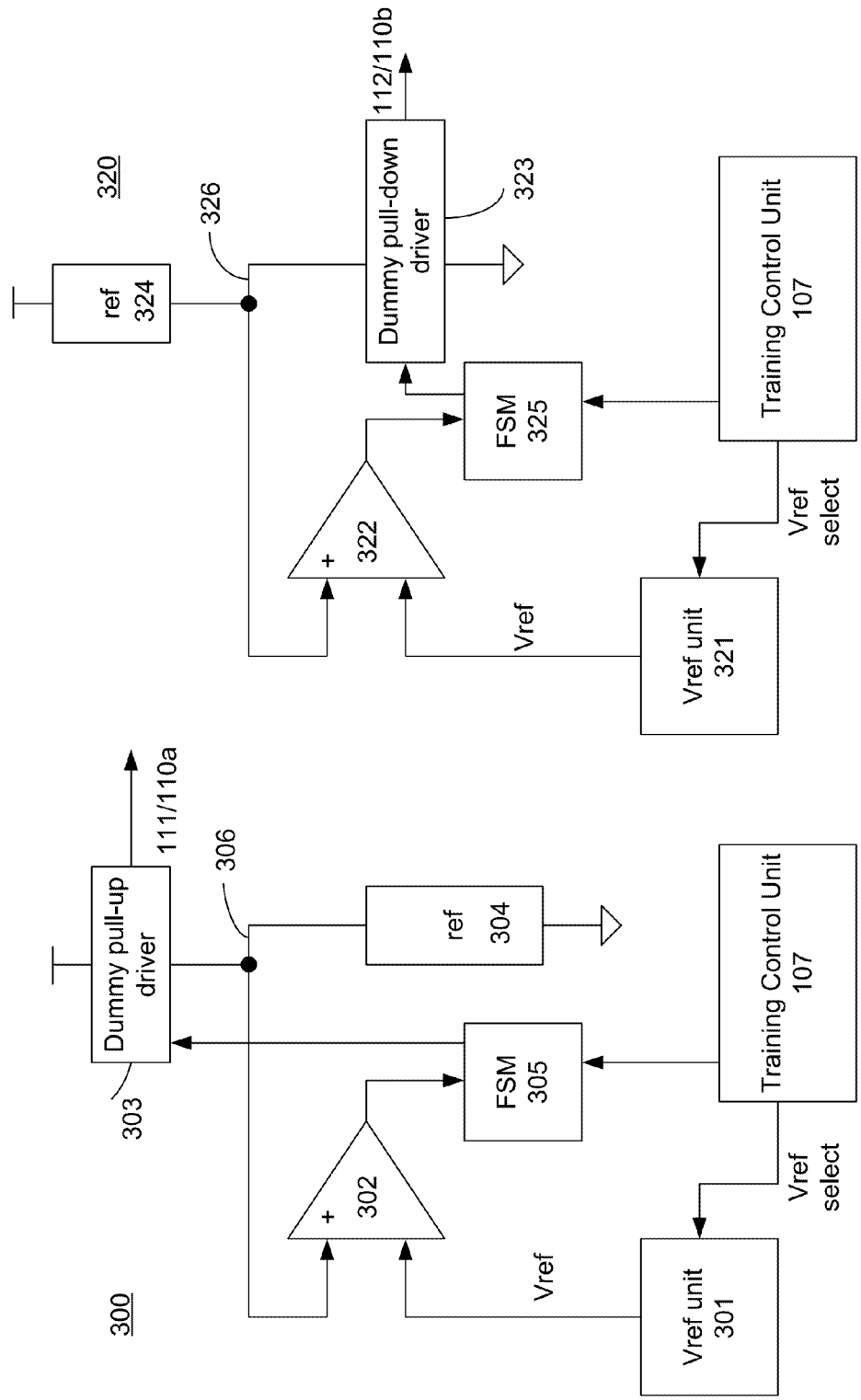
FIG. 3a shows a pull-up compensation unit.
FIG. 3b shows a pull-down compensation unit.

FIG. 3A is a pull-up compensation unit 300 (e.g., 105) to program the equalizer (e.g., 104) with fine granularity of equalization while also compensating the pull-up impedance (e.g., of pull-up driver 102) of the I/O driver (e.g., 200), according to one embodiment of the disclosure. It is pointed out that those elements of FIG. 3A having the same reference numbers (or names) as the elements of any other figure can operate or function in any manner similar to that described, but are not limited to such.

FIG. 3A is described with reference to FIGS. 1-2. In one embodiment, pull-up compensation unit 300 (e.g., 105) comprises a voltage reference unit 301, a comparator 302, a dummy pull-up driver 303, a reference (e.g., reference impedance) 304, a finite state machine (FSM) 305, and training control unit 107. While the embodiment of FIG. 3A shows several components as distinct components, they may be lumped together in a single component or fewer or more components than shown.

In one embodiment, Vref unit 301 comprises one or more voltage references that are selectable by a Vref select signal and provided as Vref to comparator 302. In one embodiment, Vref unit 301 comprises an analog multiplexer that receives Vref select signal to select between two or more voltage references from any source (e.g., voltage/resistor divider, bandgap reference, external reference, etc.) and provide Vref as the reference signal to comparator 302. In one embodiment, voltage level of Vref corresponds to impedance setting for the pull-up driver 102. For example, Vref is set to 0.5V and reference 304 is set to the target impedance of pull-up driver 102. In another example, Vref is set to another voltage that corresponds to the granularity of equalizer pull-up section 104*a* of equalizer 104.

In one embodiment, comparator 302 is a differential amplifier. In another embodiment, comparator 302 is a multi-stage operational amplifier (OPAMP). In one embodiment, comparator 302 receives a reference voltage Vref from the Vref unit 301 and another signal from the node coupled between reference 304 and dummy pull-up driver 303. In one embodiment, output of comparator 302 is received by FSM 305. In one embodiment, output of comparator 302 trips (i.e., changes its state from low to high or high to low when the inputs of the comparator are substantially equal) indicating to FSM 305 that inputs of comparator 302 are substantially equal. In such an embodiment, impedance of dummy pull-up driver 303 is substantially equal to impedance of reference 304 (if Vref is set to half of the power supply level).

In one embodiment, reference 304 is an external resistor. In one embodiment, reference 304 is a highly precise resistor with resistance tolerance of 1% or less. In one embodiment, value of the reference resistance of resistor 304 is used to determine the impedance codes 111/110*a*. In one embodiment, reference 304 is coupled between ground supply and node 306 of dummy pull-up diver 303, where node 306 represents pad node 108.

In one embodiment, FSM 305 comprises a filter (e.g., a low pass filter), a counter, and other logic units to generate a code that is received by the dummy pull-up driver 303. In one embodiment, the filter (not shown) is used to filter glitches from the output of the comparator 302. In one embodiment, the counter (not shown) is used to count the number of legs/segments of pull-up driver 102 that are turned on/off. In one embodiment, dummy pull-up driver 303 is identical to the pull-up driver 102 and the equalizer pull-up section 104*a* of the equalizer 104.

In one embodiment, FSM 305 turns on or off one dummy pull-up driver (303) leg or segment or transistor at a time (or collectively) to adjust the impedance of dummy pull-up driver 303 till the voltage on node 306, coupled between reference 304 and dummy pull-up driver 303, is substantially equal to the voltage of Vref. In one embodiment, final code 111/110*a* of FSM 305, for which the inputs of comparator 302 are substantially equal to one another, is sent to pull-up driver 102 or equalizer 104.

In one embodiment, training control unit 107 provides Vref select signal for Vref unit 301 to select the Vref for generating codes 111/110*a*. In one embodiment, training control unit 107 selects Vref level to determine codes 111 for pull-up driver 102. In one embodiment, training control unit 107 selects a Vref level to determine codes 110*a* for the equalizer pull-up section 104*a* of the equalizer 104. In one embodiment, training control unit 107 selects the Vref levels according to a method described with reference to FIG. 4.

FIG. 3B is a pull-down compensation unit 320 (e.g., 106) to program the equalizer (e.g., 104) with fine granularity of equalization while also compensating the pull-down impedance of the I/O driver, according to one embodiment of the disclosure. It is pointed out that those elements of FIG. 3B having the same reference numbers (or names) as the elements of any other figure can operate or function in any manner similar to that described, but are not limited to such. FIG. 3B is described with reference to FIGS. 1-2.

In one embodiment, pull-down compensation unit 106/320 comprises a voltage reference unit 321, a comparator 322, a dummy pull-down driver 323, a reference (e.g., reference impedance) 324, FSM 325, and training control unit 107. While the embodiment of FIG. 3B shows several components as distinct components, they may be lumped together in a single component or fewer or more components than shown.

In one embodiment, Vref unit 321 comprises one or more voltage references that are selectable by a Vref select signal and provided as Vref to comparator 322. In one embodiment, Vref unit 321 comprises an analog multiplexer that receives Vref select signal to select between two or more voltage references from any source (e.g., voltage/resistor divider, bandgap reference, external reference, etc.) and to provide Vref as the reference signal to the comparator 322. In one embodiment, voltage level of Vref corresponds to impedance setting for pull-down driver 103. For example, Vref is set to 0.5V and the reference 324 is set to the target impedance of pull-down driver 103. In another example, Vref is set to another voltage that corresponds to the granularity of equalizer pull-down section 104b of equalizer 104.

In one embodiment, comparator 322 is a differential amplifier. In another embodiment, comparator 322 is a multi-stage OPAMP. In one embodiment, comparator 322 receives a reference voltage Vref from the Vref unit 321 and another signal from the node coupled between reference 324 and dummy pull-down driver 323. In one embodiment, output of comparator 322 is received by FSM 325. In one embodiment, output of comparator 322 trips (i.e., changes its state from low to high or high to low when the inputs of the comparator are substantially equal) indicating to FSM 325 that the inputs of the comparator 322 are substantially equal. In such an embodiment, the impedance of dummy pull-down driver 323 is substantially equal to the impedance of reference 324 (if Vref is set to half of the power supply level).

In one embodiment, reference 324 is an external resistor. In one embodiment, reference 324 is highly precise resistor with resistance tolerance of 1% or less. In one embodiment, value of the reference resistance of resistor 324 is used to determine impedance codes 112/110b. In one embodiment, reference 324 is coupled between power supply and node 326 of dummy pull-down diver 323, where node 326 represents pad node 108.

In one embodiment, FSM 325 comprises a filter (e.g., a low pass filter), a counter, and other logic units to generate a code that is received by the dummy pull-down driver 323. In one embodiment, the filter (not shown) is used to filter glitches from the output of the comparator 322. In one embodiment, the counter (not shown) is used to count the number of legs/segments of dummy pull-down driver 323 that are turned on/off. In one embodiment, dummy pull-down driver 323 is identical to pull-down driver 103 and equalizer pull-down section 104b of equalizer 104.

In one embodiment, FSM 325 turns on or off one dummy pull-down driver (323) leg or segment or transistor at a time (or collectively) to adjust the impedance of dummy pull-down driver 323 till the voltage on node 326, coupled between reference 324 and dummy pull-down driver 323, is substantially equal to the voltage of Vref. In one embodiment, final code 112/110b of FSM 325, for which the inputs of comparator 322 are substantially equal to one another, is sent to pull-down driver 103 or equalizer 104.

In one embodiment, training control unit 107 provides Vref select signal to Vref unit 321 to select the Vref for generating codes 112/110b. In one embodiment, training control unit 107 selects Vref level to determine codes 112 for pull-down driver 103. In one embodiment, training control unit 107 selects a Vref level to determine codes 110b for pull-down section 104b of equalizer 104. In one embodiment, training control unit 107 selects the Vref levels according to a method described with reference to FIG. 4.

In one embodiment, FIG. 3A and FIG. 3B are coupled together such that a single comparator, FSM, Vref unit, and training control unit is used to reduce overall circuit area. In other embodiments, the circuits of FIG. 3A and FIG. 3B are separate and distinct.

Figure 4:
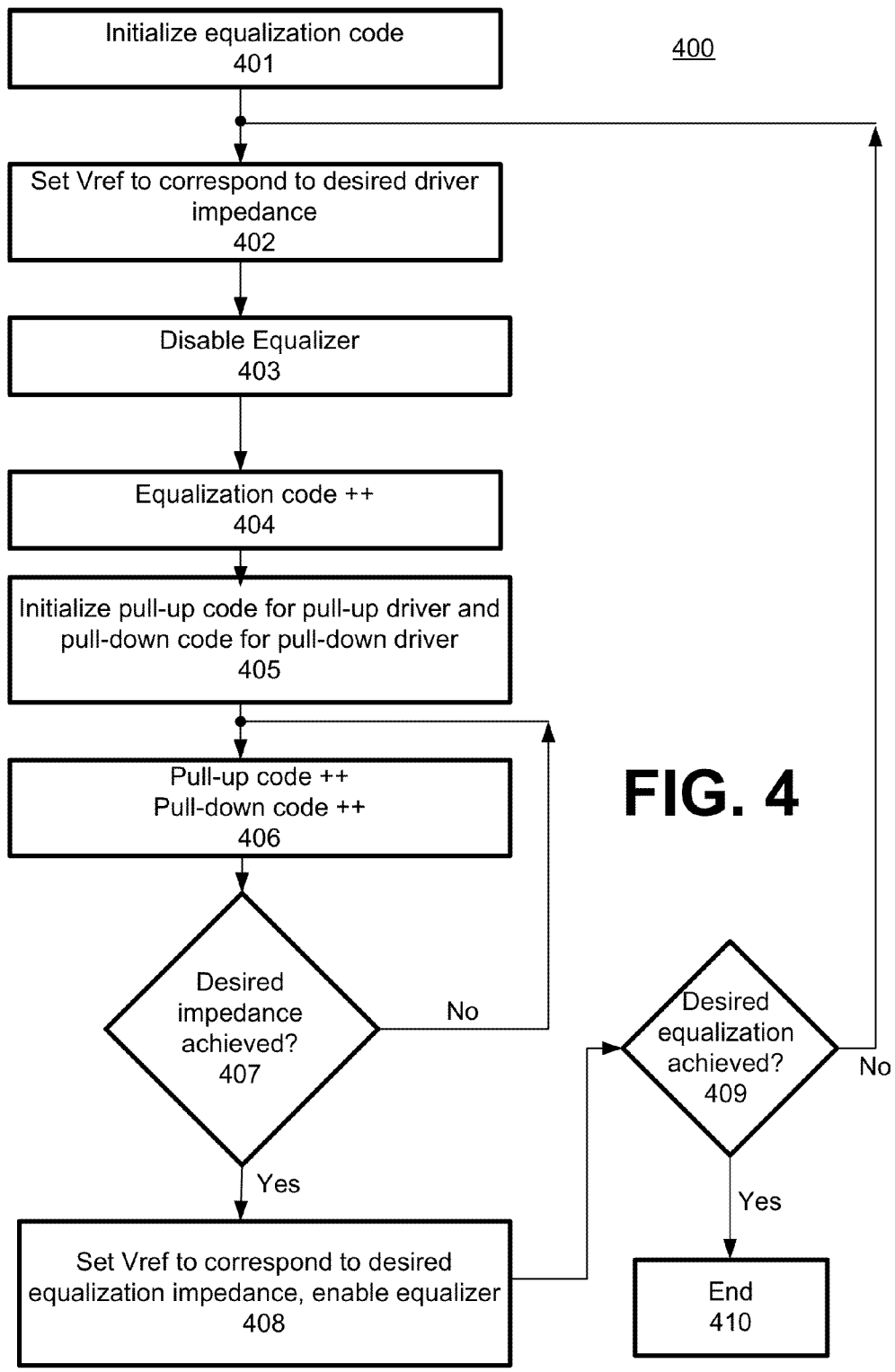
FIG. 4 shows a training methodology for the driver circuit of FIG. 1A.

FIG. 4 is flowchart 400 showing the method of programming the equalizer (e.g., 104) with a fine equalizing code while maintaining the impedances of pull-up and pull-down drivers 102 and 103 substantially constant, according to one embodiment of the disclosure. It is pointed out that those elements of FIG. 4 having the same reference numbers (or names) as the elements of any other figure can operate or function in any manner similar to that described, but are not limited to such.

Although blocks in the flowcharts with reference to FIG. 4 are shown in a particular order, the order of the actions can be modified. Thus, the illustrated embodiments can be performed in a different order, and some actions/blocks may be performed in parallel. The flowchart of FIG. 4 is illustrated with reference to the embodiments of FIGS. 1-3. Some of the blocks and/or operations listed in FIG. 4 are optional in accordance with certain embodiments. The numbering of the blocks presented is for the sake of clarity and is not intended to prescribe an order of operations in which the various blocks must occur. Additionally, operations from the various flows may be utilized in a variety of combinations.

So as not to obscure the embodiments of the disclosure, the operations/controls of the embodiments of FIG. 3A and FIG. 3B are discussed together when explaining the flowchart 400. At block 401, equalization codes 110a/110b are initialized. For example, the equalization codes 110a and 110b are initialized so that all devices of equalizer 104 are turned off. In one embodiment, equalization codes 110a and 110b are initialized so that all devices, but one, of equalizer 104 is turned off. In the training flowchart 400, dummy or replicate circuits (i.e., replicate of driver 200 circuits) are used and the actual driver 200 and its components are not used directly.

At block 402, training control unit 107 sets the Vref Select signal to select a reference level Vref from Vref units 301/321. As discussed herein, Vref level indicates the impedance for dummy pull-up driver 303 and dummy pull-down driver 323. Accordingly, Vref level is used to set the impedances of pull-up driver 102, pull-down driver 103, equalizer pull-up section 104a of equalizer 104, and equalizer pull-down section 104b of the equalizer 104. At block 402, training control unit 107 selects the Vref level for desired (i.e., target) impedance of the pull-up driver 102.

At block 403, dummy equalizer (i.e., replica of equalizer 104) is disabled. In one embodiment, compensation units 300 and 320 of FIGS. 3A-B include dummy equalizer sections 104a and 104b in the dummy pull-up driver 303 and dummy pull-down driver 323 respectively. At block 403, dummy equalizer sections 104a and 104b in compensation units 300 and 320 are disabled. In one embodiment, during the training flowchart 400, actual driver 200 does not participate in the training. In one embodiment, when processor 101 turns on, the training flowchart 400 begins using compensation units 300 and 320. In such an embodiment, when training flowchart 400 completes, codes 111, 110a, 112, and 110b are stored in a storage medium (e.g., registers, non-volatile memory, or volatile memory) and distributed to all I/Os before normal operation begins.

At block 404, equalization code is initially set by training control 107 (or the FSMs 305/325) to the initialization code (as done at block 401) and is set to increment by one (or any predetermined number) when block 404 is revisited during an execution of the flowchart.

At block 405, FSMs 305/325 initialize the non-equalization codes for dummy pull-up and dummy pull-down drivers 303 and 323. For example, the transistors or legs of dummy pull-up and dummy pull-down drivers 303 and 323 are initialized so that some are on and some are off.

At block 406, non-equalization codes for dummy pull-up and dummy pull-down drivers 303 and 323 are incremented from their initialized value. For example, the transistors or legs of dummy pull-up and dummy pull-down drivers 303 and 323 are turned on or off one at a time with reference to the initialized code to change (increase or decrease) the impedance of the dummy pull-up and dummy pull-down drivers 303 and 323. The term "++" indicates that the code is being incremented by 1 when the block (which has "++") is executed again.

At block 407, a determination is made by the comparators 302 and 322 whether the desired impedance is achieved for the dummy pull-up and dummy pull-down drivers 303 and 323 respectively. If the desired (or target) impedance is not achieved for the dummy pull-up and dummy pull-down drivers 303 and 323, then the flowchart proceeds back to block 406 and the non-equalization code for dummy pull-up and dummy pull-down drivers 303 and 323 is incremented by 1. The process continues till the desired (or target) impedance for dummy pull-up and dummy pull-down drivers 303 and 323 is achieved. In one embodiment, the desired (or target) impedance is programmable.

When the desired (or target) impedance for dummy pull-up and dummy pull-down drivers 303 and 323 is achieved, the process proceeds to block 408. When the desired (or target) impedance for the dummy pull-up and dummy pull-down drivers 303 and 323 is achieved, dummy pull-up and dummy pull-down drivers 303 and 323 are trained for the target pull-up and pull-down impedances for pull-up and pull-down drivers 102 and 103 respectively i.e., codes 111 and 112 are determined for the desired target impedance for pull-up and pull-down drivers 102 and 103.

At block 408, training control unit 107 sets Vref (via Vref Select) to correspond to desired equalization impedance for equalizer 104. At block 408, previously disabled equalizer 104 (section of the dummy pull-up and pull-down drivers 303 and 323) is enabled. Block 408 begins the process of the second loop of the two-dimensional loops of the flowchart 400. In the second loop, the granularity level of equalizer 104 is determined by enabling equalizer 104 (equalizer up section of the dummy pull-up and pull-down drivers 303 and 323) using the already trained for codes (111 and 112) for the impedances for pull-up and pull-down drivers 102 and 103.

At block 409, a determination is made whether the desired equalization impedance is achieved. If it is determined that the desired equalization impedance is not achieved, the process proceeds to block 402 i.e., the first loop of the two-dimensional loop. At block 402, Vref is again set by training control unit 107 to correspond to the target impedance of pull-up and pull-down drivers 102 and 103. The process explained in blocks 403 to 407 is repeated again so that codes 111 and 112 for pull-up and pull-down drivers 102 and 103 are determined again that match the target (or desired) impedances for the for pull-up and pull-down drivers 102 and 103 while using the updated equalization code. The updated equalization code is the incremented equalization code (incremented at block 404).

At block 408, after the codes 111 and 112 for pull-up and pull-down drivers 102 and 103 are determined again that match the target (or desired) impedances for pull-up and pull-down drivers 102 and 103, the equalizer section (section of dummy pull-up and pull-down drivers 303 and 323) is enabled by training control unit 107. At block 408, training control unit 107 sets Vref to correspond to the target impedance for equalizer 104.

At block 409, comparators 302 and 322 determine whether the desired equalization is achieved. The process proceeds back to block 402 till codes 110a and 110b for the equalizer section (section of dummy pull-up and pull-down drivers 303 and 323) achieves the target granularity for equalization. Once the codes 110a and 110b for the equalizer section (section of dummy pull-up and pull-down drivers 303 and 323) achieves the target granularity for equalization, the process ends at block 410.

With reference to the embodiment of FIGS. 2-3, dummy four segments for pull-up and pull-down drivers 102 and 103 and dummy one segment for equalizer (104a and 104b) are used in the compensation units 105 and 106 during the first loop (indicated by block 402 to block 407 of FIG. 4) to train (following the process 400 of FIG. 4) for desired impedances of the pull-up driver 102 and pull-down driver 103 with equalization disabled.

In one embodiment, desired impedance for pull-up and pull-down drivers 102 and 103 includes equalization pull-up and pull-down sections 104a and 104b. To "disable equalization" generally refers to turning on equalization pull-up and pull-down sections 104a and 104b i.e., all five segments are turned on to achieve the desired impedance. In one embodiment, equalization segment codes 110a and 110b are merged with codes 111 and 112 respectively and used for setting the desired impedance. For example, codes 112 and 110b are combined to train pull-down section to have 36 Ohms, and codes 111 and 110a are combined to train pull-up section to have 36 Ohms.

The first loop of FIG. 4 trains the impedance of pull-up driver 102 and pull-down driver 103 to desired impedances with a constant equalization code and with the equalizer section of the dummy pull-up and pull-down drives 303 and 323 being disabled. For example, code 111 of pull-up driver 102 is trained to generate 36 Ohms impedance for pull-up driver 102. In this embodiment, when the five segments (which include the equalization pull-up and pull-down sections 104a/104b) use the same codes 111 and 112, 20% equalization is achieved. In one embodiment, the 2-D flowchart 400 begins with equalization code of one. In one embodiment, the desired impedance for pull-up and pull-down drivers 102 and 103 includes equalization pull-up and pull-down sections 104a and 104b.

In one embodiment, in the second loop (from 408 to 407 of FIG. 4) if it is determined that the desired equalization is greater or less than 20%, then the equalization code is incremented (at block 404 because the process proceeds from block 409 to block 402) and the impedance for pull-up and pull-down drivers 102 and 103 are again determined using the new equalization code. In such an embodiment, equalizer pull-up section 104a is turned off and the overall dummy pull-up driver 303 (which includes the pull-up driver 102 and the equalizer pull-up section 104a) is trained again to achieve the target impedance for pull-up driver 102. In such an embodiment, equalizer pull-down section 104b is turned off and the overall dummy pull-down driver 323 (which includes pull-down section 103 and equalizer pull-down section 104*b*) is trained again to achieve the target impedance for pull-down driver 103.

The process is repeated till the desired equalization granularity for the equalizer 104 is achieved. During this process, the first loop of process 400 maintains the impedances of pull-up and pull-down drivers 102 and 103 substantially constant to their target impedance levels. With the closed-loop training of the pull-up and pull-down driver impedances (of pull-up and pull-down drivers 102 and 103 respectively) and the closed loop training of the equalization granularity (of the equalizer 104), the impedance of pull-up and pull-down drivers 102 and 103 is kept substantially constant.

One technical effect of having the impedance of the pull-up and pull-down drivers 102 and 103 kept substantially constant is that the equalization (i.e., de-emphasis of the signal on pad 108) does not cause signal integrity issues that may be caused if the impedances of the pull-up and pull-down drivers 102 and 103 are allowed to vary during the de-emphasis of the signal on pad 108.

In this embodiment, since the equalization segment code is incremented by one in the second loop (of FIG. 4), the impedance of the equalization segment is a fraction of total impedance of the driver i.e., ⅕ with reference to 5 segments of FIG. 2. Accordingly, the embodiments of this disclosure allow the granularity of equalizer 104 to be controlled in finer increments (i.e., finer granularity) while maintaining the impedances of pull-up and pull-down drivers 102 and 103 substantially constant.

In one embodiment, flowchart 400 is implemented as computer executable instructions to be executed by processor 101. In one embodiment, the computer executable instructions are stored on a machine storage medium. In one embodiment, the computer executable instructions are part of an operating system.

Figure 5:
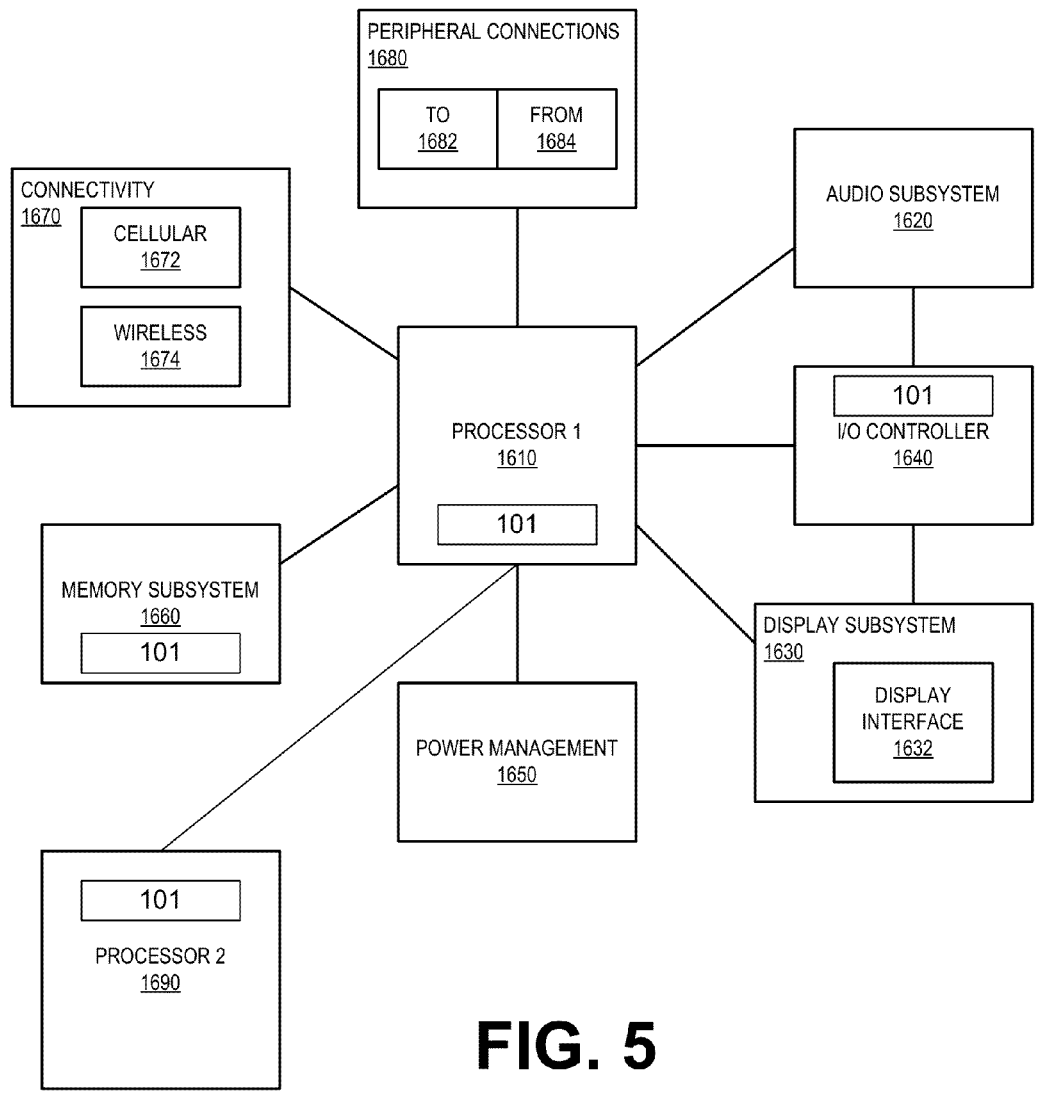
FIG. 5 shows a computing system.

FIG. 5 is a system-level diagram of a smart device 1600 comprising the processor or circuits of FIG. 1A, according to one embodiment of the disclosure. It is pointed out that those elements of FIG. 5 having the same reference numbers (or names) as the elements of any other figure can operate or function in any manner similar to that described, but are not limited to such.

FIG. 5 also illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in device 1600.

In one embodiment, computing device 1600 includes a first processor 1610 with the components of processor 101 of FIG. 1A, and a second processor 1690 with the components of processor 101 of FIG. 1A, according to the embodiments discussed herein. Other blocks of the computing device with I/O drivers may also include the components of processor 101 of FIG. 1A. The various embodiments of the present disclosure may also comprise a network interface within 1670 such as a wireless interface so that a system embodiment may be incorporated into a wireless device, for example, cell phone or personal digital assistant.

In one embodiment, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to device 1600 through which a user might interact with the system. For example, devices that can be attached to the computing device 1600 might include microphone devices, speaker or stereo systems, video systems or other display device, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in device 1600. Memory can include nonvolatile (state does not change if power to the memory device is interrupted) and/or volatile (state is indeterminate if power to the memory device is interrupted) memory devices. Memory 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, or other type of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on device 1600. Additionally, a docking connector can allow device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or an element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented i.e., such specifics should be well within purview of one skilled in the art. Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment, chip comprises: a pull-up driver with a first impedance, the pull-up driver coupled to a node; a pull-down driver with a second impedance, the pull-down driver coupled to the node; and an equalizer coupled to the pull-up and pull-down drivers, wherein the equalizer is operable to be trained to deemphasize a signal driven on the node while maintaining the first and second impedances substantially constant.

In one embodiment, the equalizer is part of a parallel input-output (I/O) link. In one embodiment, the first impedance is independently controllable from control of the second impedance. In one embodiment, the chip further comprises: a pull-up driver compensation unit which is operable to determine a code for setting the first impedance for the pull-up driver, and a code for setting a pull-up granularity for de-emphasizing the signal by the equalizer. In one embodiment, the chip further comprises: a pull-down driver compensation unit which is operable to determine a code for setting the second impedance for the pull-down driver, and a code for setting a pull-down granularity for de-emphasizing the signal by the equalizer. In one embodiment, the equalizer is disabled when the pull-up driver compensation unit is determining the code for setting the first impedance for the pull-up driver. In one embodiment, the equalizer is disabled when the pull-down driver compensation unit is determining the code for setting the second impedance for the pull-up driver.

In one embodiment, the pull-up driver compensation unit and the pull-down driver compensation unit determine the codes for setting the first and second impedances prior to setting the codes for the pull-up and pull-down granularities for de-emphasizing the signal by the equalizer, and wherein the codes, for the pull-up and pull-down granularities for de-emphasizing the signal by the equalizer, are programmable. In one embodiment, the pull-up driver compensation unit and the pull-down driver compensation unit are operable to determine codes again for setting the first and second impedances after setting the codes for the pull-up and pull-down granularities for de-emphasizing the signal by the equalizer.

In one embodiment, the codes for the pull-up and pull-down granularities for de-emphasizing the signal by the equalizer are different when the equalizer is in equalization mode than codes for the pull-up and pull-down granularities when the equalizer is in non-equalization mode. In one embodiment, the first and second impedances are substantially constant during a period when the equalizer is in non-equalization mode or equalization mode. In one embodiment, the equalizer comprises: a pull-up section coupled to the node; and a pull-down section coupled to the node, wherein the pull-up and pull-down sections are controllable with control signals different from control signals for controlling the first and second impedances of the pull-up and pull-down drivers.

In another example, a processor comprises: a transmitter of a parallel input-output (I/O) link, the transmitter having a pull-up driver, a pull-down driver, and an equalizer coupled to the pull-up and pull-down drivers; and pull-up driver and pull-down driver compensation units to determine codes for first impedance of the pull-up driver and a second impedance of the pull-down driver respectively, wherein the equalizer is disabled when the pull-up driver and pull-down driver compensation units are determining codes for the first and second impedances.

In one embodiment, the first impedance is independently controllable from control of the second impedance. In one embodiment, the equalizer is operable to be trained to deemphasize a signal driven on a node, coupled to the pull-up driver, pull-down driver, and the equalizer, while maintaining the first and second impedances substantially constant. In one embodiment, the pull-up driver compensation unit is operable to determine a code for setting a pull-up granularity for de-emphasizing the signal by the equalizer, wherein the code, for setting a pull-up granularity for de-emphasizing the signal by the equalizer, is programmable; and the pull-down driver compensation unit is operable to determine a code for setting a pull-down granularity for de-emphasizing the signal by the equalizer, wherein the code, for setting a pull-down granularity for de-emphasizing the signal by the equalizer, is programmable. In one embodiment, the first and second impedances are substantially constant during a period when the equalizer is in non-equalization mode or equalization mode.

In another example, a method comprises: initializing non-equalization codes for a pull-up driver and a pull-down driver respectively; setting a reference signal to correspond to a target impedance value for the pull-up and pull-down drivers; incrementing the initialized non-equalization codes for the pull-up and pull-down drivers to adjust impedances of the pull-up and pull-down drivers; determining whether the impedances corresponding to the pull-up and pull-down drivers, respectively, are substantially equal to the target impedance value; setting the reference signal to correspond to an equalization granularity level for an equalizer which coupled to the pull-up and pull-down drivers; and incrementing equalization codes for the equalizer when it is determined that the equalization granularity level for the equalizer is not met. In one embodiment, the equalizer is disabled when determining whether the impedances corresponding to the pull-up and pull-down drivers, respectively, are substantially equal to the target impedance value, and wherein the equalizer is enabled after determining that the impedances corresponding to the pull-up and pull-down drivers, respectively, are substantially equal to the target impedance value.

In another example, a system comprises: a memory unit; a processor, coupled to the memory unit, the processor including: a pull-up driver with a first impedance, the pull-up driver coupled to a node; a pull-down driver with a second impedance, the pull-down driver coupled to the node; and an equalizer coupled to the pull-up and pull-down drivers, wherein the equalizer is operable to be trained to deemphasize a signal driven on the node while maintaining the first and second impedances substantially constant; a wireless interface to allow the processor to communicate with another device; and a display unit.

In one embodiment, the equalizer is part of a parallel input-output (I/O) link. In one embodiment, the first impedance is independently controllable from control of the second impedance. In one embodiment, the first and second impedances are substantially constant during a period when the equalizer is in non-equalization mode or equalization mode.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

The invention claimed is:

1. A method, comprising:
for a driver comprising a plurality of parallel transistor segments each comprised of a pull-up transistor and a pull-down transistor, where, a percentage of the parallel transistor segments impose logic-low de-emphasis by having a respective pull-up transistor enabled while said driver is driving a logic level low with a respective pull-down transistor of the other transistor segments and impose logic-high de-emphasis by having a respective pull-down transistor enabled while said driver is driving a logic level high with a respective pull-up transistor of the other transistor segments, training the driver as follows:
stepping respective transistor drive strength of the percentage of segments in a respective small increment to a new respective drive strength to adjust the logic-low and logic-high de-emphasis with fine granularity;
adjusting respective transistor drive strength of the other segments while the percentage of segments are enabled to set the driver's impedance to a desired value;
repeating the stepping and the adjusting until a desired logic-low de-emphasis, a desired logic-high de-emphasis and a desired driver impedance are achieved.

2. The method of claim 1 wherein the adjusting includes use of a reference voltage.

3. The method of claim 2 wherein at least one of the desired logic-low de-emphasis and logic-high de-emphasis are confirmed through use of a second reference voltage.

4. The method of claim 1 wherein at least one of the desired logic-low de-emphasis and the desired logic-high de-emphasis are confirmed through use of a reference voltage.

5. The method of claim 1 wherein each of the pull-up and pull-down transistors of the percentage of segments and each of the pull-up and pull-down transistors of the other segments have their own respective code to establish their own respective drive strength.

6. The method of claim 5 where each of the respective codes are established individually.

7. The method of claim 1 wherein, before any of the stepping, adjusting or repeating is performed, the following is performed:
setting the respective drive strength of the percentage of segments to be the same as the respective drive strength of the other segments to initially set the logic-low de-emphasis and the logic-high de-emphasis equal to the percentage.

8. The method of claim 7 wherein after the setting and before any of the stepping, adjusting or repeating is performed, the following is performed:
adjusting respective transistor drive strength of the percentage of segments and the other segments to initially set the driver's impedance to the desired value.

9. The method of claim 1 wherein before any of the stepping, adjusting or repeating is performed, the following is performed:
adjusting respective transistor drive strength of the percentage of segments and the other segments to initially set the driver's impedance to the desired value.

10. A semiconductor chip, comprising:
a driver comprising a plurality of parallel transistor segments each comprised of a pull-up transistor and a pull-down transistor, where, a percentage of the parallel transistor segments are to impose logic-low de-emphasis by having a respective pull-up transistor enabled while said driver is driving a logic level low with a respective pull-down transistor of the other transistor segments and are also to impose logic-high de-emphasis by having a respective pull-down transistor enabled while said driver is driving a logic level high with a respective pull-up transistor of the other transistor segments, the driver comprising training and compensation circuitry to:
step respective transistor drive strength of the percentage of segments in a respective small increment to a new respective drive strength to adjust the logic-low and logic-high de-emphasis with fine granularity;
adjust respective transistor drive strength of the other segments while the percentage of segments are enabled to set the driver's impedance to a desired value;
repeat the stepping and the adjusting until a desired logic-low de-emphasis, a desired logic-high de-emphasis and a desired driver impedance are achieved.

11. The semiconductor chip of claim 10 further comprising a reference voltage circuit coupled to the driver to establish a first reference voltage during the adjusting.

12. The semiconductor chip of claim 10 further comprising a reference voltage circuit coupled to the driver to establish a second reference voltage to confirm at least one of the logic-low de-emphasis and logic-high de-emphasis.

13. The semiconductor chip of claim 10 wherein the training and compensation circuitry is to maintain for each of the pull-up and pull-down transistors of the percentage of segments and for each of the pull-up and pull-down transistors of the other segments a respective code to establish their own respective drive strength.

14. The semiconductor chip of claim 13 wherein the training and compensation circuitry includes a pull-up compensation circuit and a pull-down compensation circuit.

15. The semiconductor chip of claim 10 wherein the training and compensation circuitry is to, before any of the stepping, adjusting or repeating is performed, perform the following:
set the respective drive strength of the percentage of segments to be the same as the respective drive strength of the other segments to initially set the logic-low de-emphasis and the logic-high de-emphasis equal to the percentage.

16. The semiconductor chip of claim 15 wherein the training and compensation circuitry is to, after the setting and before any of the stepping, adjusting or repeating is performed, perform the following:
adjust respective transistor drive strength of the percentage of segments and the other segments to initially set the driver's impedance to the desired value.

17. A semiconductor chip, comprising:
a processor and a driver, said driver comprising a plurality of parallel transistor segments each comprised of a pull-up transistor and a pull-down transistor, where, a percentage of the parallel transistor segments are to impose logic-low de-emphasis by having a respective pull-up transistor enabled while said driver is driving a logic level low with a respective pull-down transistor of the other transistor segments and are also to impose logic-high de-emphasis by having a respective pull-down transistor enabled while said driver is driving a logic level high with a respective pull-up transistor of the other transistor segments, the driver comprising training and compensation circuitry to:
step respective transistor drive strength of the percentage of segments in a respective small increment to a new respective drive strength to adjust the logic-low and logic-high de-emphasis with fine granularity;
adjust respective transistor drive strength of the other segments while the percentage of segments are enabled to set the driver's impedance to a desired value;
repeat the stepping and the adjusting until a desired logic-low de-emphasis, a desired logic-high de-emphasis and a desired driver impedance are achieved.

18. The semiconductor chip of claim 17 wherein the training and compensation circuitry is to maintain is to maintain for each of the pull-up and pull-down transistors of the percentage of segments and for each of the pull-up and pull-down transistors of the other segments a respective code to establish their own respective drive strength.

19. The semiconductor chip of claim 17 wherein the training and compensation circuitry is to, before any of the stepping, adjusting or repeating is performed, perform the following:
set the respective drive strength of the percentage of segments to be the same as the respective drive strength of the other segments to initially set the logic-low de-emphasis and the logic-high de-emphasis equal to the percentage.

20. The semiconductor chip of claim 19 wherein the training and compensation circuitry is to, after the setting and before any of the stepping, adjusting or repeating is performed, perform the following:
adjust respective transistor drive strength of the percentage of segments and the other segments to initially set the driver's impedance to the desired value.

* * * * *